METHODS OF BONDING ELECTRICAL CONDUCTORS TO ELECTRICAL COMPONENTS

Filed March 20, 1964 2 Sheets-Sheet 1

INVENTORS

D. H. Pruden
D. Schoenthaler,

BY C. E. Martin, Jr.

ATTORNEY

United States Patent Office 3,302,277
Patented Feb. 7, 1967

3,302,277
METHODS OF BONDING ELECTRICAL CONDUCTORS TO ELECTRICAL COMPONENTS
David H. Pruden and David Schoenthaler, Trenton, N.J., assignors to Western Electric Company, Incorporated, New York, N.Y., a corporation of New York
Filed Mar. 20, 1964, Ser. No. 353,550
8 Claims. (Cl. 29—407)

This invention relates to methods of bonding electrical conductors to electrical components and more particularly to methods of determining the quality of bonds formed by vibratory bonding techniques between terminal leads and elements of electrical components provided with rectifying junctions.

In the manufacture of electrical components, considerable effort has been expended to produce components having identical electrical characteristics. To achieve this result in the manufacture of electrical components such as transistors, controls have been provided to insure conformity of semiconductor wafers to high standards of uniformity and quality. Additionally, quality controls have been provided for assembly processes such as those for mounting semiconductor wafers on transistor headers.

Such quality controls may be rendered ineffective to insure the desired electrical characteristics, if, in the final steps of manufacture, electrical conductors are not properly secured or bonded to the components. It is necessary, therefore, to provide quality controls for the final manufacturing steps, and in particular, for the step of bonding of the electrical conductors to the components.

In the past, electrical conductors have been satisfactorily bonded to electrical components by vibratory bonding techniques. Problems have been encountered, however, in providing accurate methods of checking the quality of the bonds produced by the vibratory bonding techniques.

Research conducted in an endeavor to overcome such problems and resulting in the present invention, indicates that when vibratory bonding energy is utilized for producing bonds between electrical conductors and electrical components, such as transistors provided with rectifying junctions, the electrical characteristics of the rectifying junctions are modified according to the quality of the bonds produced.

It is an object of the present invention to provide new and improved methods of bonding electrical conductors to electrical components.

Another object of the present invention resides in the provision of methods of determining the quality of bonds formed by vibratory bonding techniques between terminal leads and elements of electrical components provided with rectifying junctions.

Still another object of the present invention resides in methods of measuring changes of the electrical characteristics of a rectifying junction provided in an electrical component to determine the mechanical characteristics of a bond produced by vibrating an electrical conductor relative to the electrical component.

A further object of the present invention resides in methods of controlling the amount of vibratory energy introduced to a bonding zone formed between an electrical conductor and an electrical component according to measured changes of the electrical characteristics of the electrical component caused by the vibratory energy.

With these and other objects in view, the present invention contemplates a method of determining the quality of a bond produced by vibratory techniques between an element and an electrical component which develops a voltage drop upon passage of current therethrough. The element and the electrical component are urged into mutual contact at a bonding area of the component and a test current is passed through the electrical component so that an initial voltage drop is produced across the component. Bonding energy, in the form of mechanical vibration, is applied to the element to bond the element to the bonding area. During the application of the bonding energy and with the test current being passed through the electrical component, the initial voltage drop changes according to the quality of the bond produced between the element and the electrical component. The change in the voltage drop is measured to indicate the quality of the bond and may be also used to control the amount of bonding energy applied to the element so that the bond is formed having maximum quality.

These and other objects of the present invention will become apparent upon reference to the following description and to the accompanying drawings illustrating a preferred embodiment thereof in which.

Figure 1:
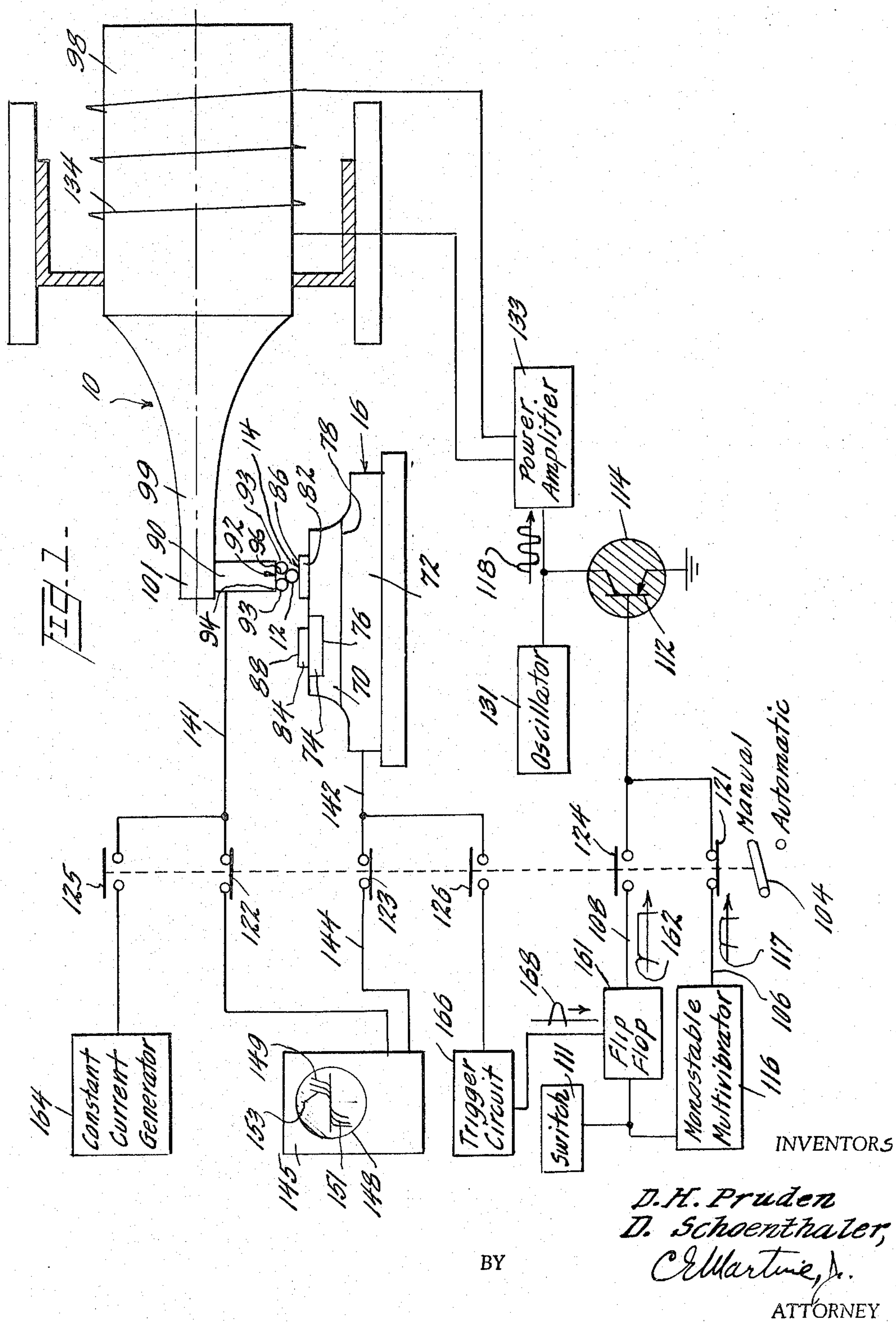
FIG. 1 is an elevational view of an apparatus adapted to perform the method of the present invention for producing bonds by vibratory techniques between an electrical conductor and an electrical component which develops a voltage drop upon passage of current therethrough.

Referring now to FIG. 1 of the drawings, an apparatus for performing the method of the present invention is shown including a bonding tool 10 which applies bonding energy in the form of high frequency, mechanical vibration to an electrical conductor 12 such as a terminal lead, wire, metal ribbon, etc. The mechanical vibration causes the terminal lead 12 to vibrate relative to a bonding area 14 of an electrical component 16, such as a transistor, having variable electrical characteristics. As a result of the vibration of the terminal lead 12 relative to the electrical component 16, the terminal lead is bonded or mechanically and electrically secured to the bonding area 14. The bonding energy imparted to the terminal lead 12 and to the bonding area 14 is effective to vary the electrical characteristics of the electrical component according to the quality of the bond formed between the terminal lead 12 and the bonding area 14.

Figure 2:
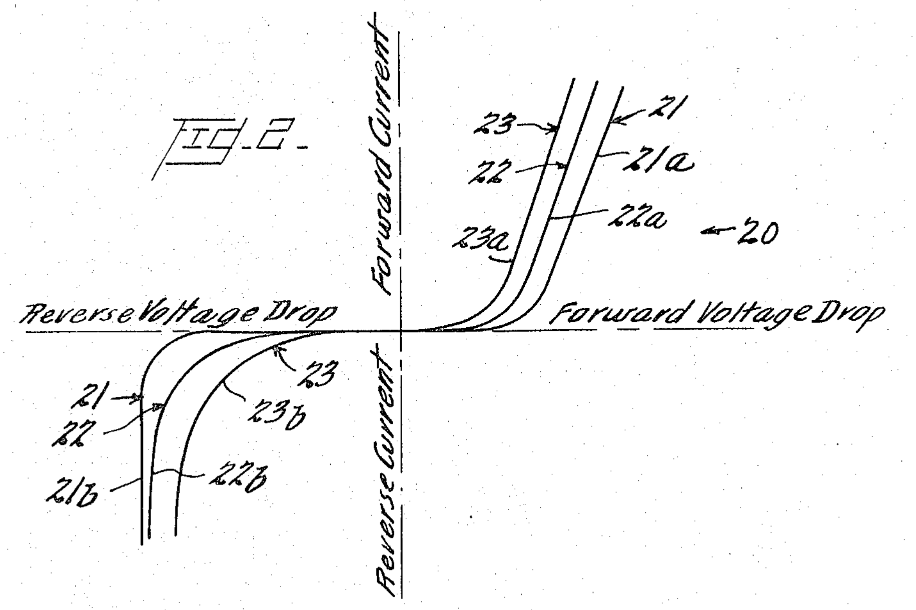
FIG. 2 is a graph of the electrical characteristics of the electrical component illustrating changes of such characteristics which occur during bonding.

More particularly, and referring now to FIG. 2, the variable electrical characteristics are illustrated by a voltage-current graph 20 of voltage drop across the electrical component 16 plotted as a function of current passing through the electrical component 16. The voltage-current characteristics before commencement of bonding are shown by a first curve 21, whereas such characteristics during and immediately after bonding are shown by second and third curves 22 and 23, respectively. It may be understood that for the same value of current passing through the electrical component 16, the voltage drop indicated by the second and third curves 22 and 23, respectively, decreases as increasing amounts of bonding energy are applied to the bonding area 14 and are absorbed by the electrical component 16. Similarly, for a given voltage drop, the second and third curves 22 and 23, respectively, illustrate increases in the current passing through the electrical component 16 during and immediately after bonding, respectively.

Figure 3:
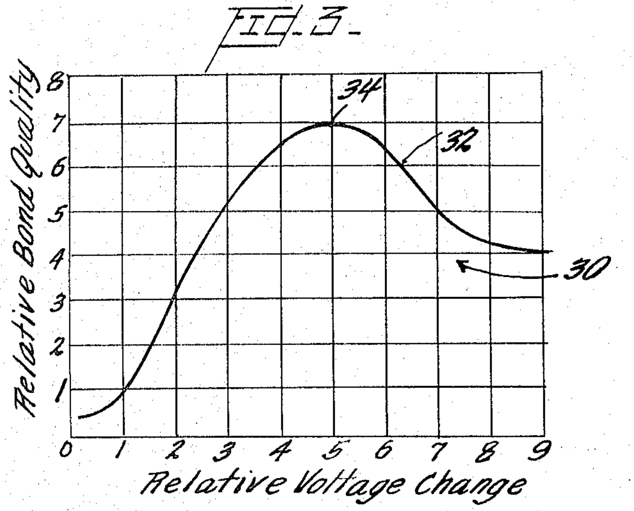
FIG. 3 is a graph illustrating the relationship between the changes of the electrical characteristics and the quality of the bonds produced.

Referring to FIG. 3, there is shown a graph 30 showing a curve 32 illustrating representative relative forward voltage changes measured across the electrical component 16 during bonding, as a function of the quality of bonds produced by the vibratory bonding tool 10. It has been discovered that there is a definite relationship between the change of the voltage drop measured across the electrical component 16 during bonding and the quality of the bonds produced. This relationship is indicated by the curve 32, from which it may be understood that the quality of the bonds increases to a maximum at a point 34 as the forward voltage changes, whereafter the quality decreases with further changes in forward voltage.

The term "quality" is used herein to describe both the mechanical strength characteristics of a bond and the amount of deformation or mashout of the terminal lead 12 which is bonded to the bonding area 14. It may be understood that the point 34 on the curve 32, in representing a point of maximum bond quality, indicates that the bond has maximum strength characteristics and that the terminal lead 12 has been subjected to a minimum of deformation.

Figure 4:
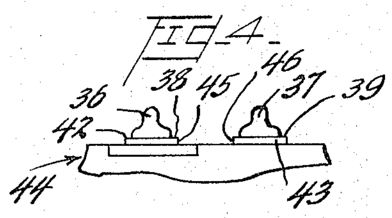
FIG. 4 is an elevational view of the electrical component illustrating the configuration of bonds having acceptable quality.

Referring to FIG. 4, acceptable quality bonds are shown formed between terminal leads 36 and 37 and respective upper surfaces 38 and 39 of an emitter stripe or electrode 42 and a base stripe or electrode 43, respectively, of an electrical component 44. The terminal leads 36 and 37 are characterized by a minimum of mashout on the respective upper surfaces 38 and 39 so that the terminal leads 36 and 37 are spaced horizontally by a distance which exceeds the spacing of adjacent edges 45 and 46 of the emitter and base stripes 42 and 43, respectively, so that cross coupling of electrical signals from the terminal lead 36 to the terminal lead 37 is precluded.

Figure 5:
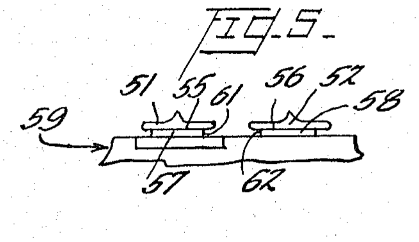
FIG. 5 is an elevational view of the electrical component illustrating the configuration of bonds having poor quality.

Referring to FIG. 5, poor quality bonds are shown formed between terminal leads 51 and 52 and respective upper surfaces 55 and 56 of respective emitter and base stripes 57 and 58 provided on an electrical component 59. The terminal leads 51 and 52 are characterized by excessive amounts of mashout so that they extend horizontally beyond adjacent edges 61 and 62 of the respective emitter and base stripes 57 and 58. In this condition of excessive mashout, electrical signals may be coupled across the terminal leads 51 and 52, causing defective operation of the transistor 16. Additionally, the strength of each bond between the terminal leads 51 and 52 and the respective stripes 57 and 58, is significantly less than that of the bonds shown in FIG. 4, which further reduces the quality of the bonds shown in FIG. 5.

The transistor 16 illustrated in FIG. 1 may be an NPN, mesa transistor which is provided with a base 70, a collector 72, and an emitter 74. The transistor 16 is provided with junctions, such as an emitter-base junction 76 and a base-collector junction 78, each of which exhibits typical diode, voltage-current characteristics such as those shown in FIG. 2.

The transistor 16 may be provided with electrodes in the form of base and emitter stripes 82 and 84, respectively, deposited in a well-known manner on the base 70 and the emitter 74, respectively. If the terminal lead 12 is to be secured to the base stripe 82, for example, the bonding area 14 includes an upper surface 86 of the base stripe 82, whereas the bonding area 14 includes an upper surface 88 of the emitter stripe 84 if the terminal lead 12 is to be secured to the emitter stripe 84.

Referring in detail to FIG. 2, the voltage-current characteristics of the base-collector junction 78, for example, include forward bias characteristics illustrated by the portions 21*a*, 22*a*, and 23*a*, and reverse bias characteristics illustrated by the portions 21*b*, 22*b*, and 23*b* of the curves 21, 22, and 23, respectively. The voltage-current characteristics are dependent upon the thermal energy level or temperature of the base-collector junction 78, for example. Bonding energy, such as vibratory energy dissipated into the transistor 16 during bonding of the terminal lead 12 to the base stripe 82, is effective to increase the temperature of both the bonding area 14 and the base-collector junction 78, so that the voltage-current characteristics are modified or varied, causing increased conductivity in both the forward and reverse directions. Such increased conductivity is shown by comparing the curves 21 and 23, for example, illustrating the respective voltage-current characteristics before and immediately after bonding.

The current I passed by either the emitter-base junction 76 or the base-collector junction 78, is related to the temperature of the respective junctions by the following equation:

$$I=I_s\left(\epsilon\frac{qV}{kT}-1\right)$$

$I_s$=the saturation current,
$q$=the electronic charge,
$V$=the voltage,
$k$=Boltzmann's constant, and
$T$=the absolute temperature.

Referring in detail to FIG. 1, the bonding tool 10 is shown including a bonding tip 90 provided with a bonding surface 92. The bonding surface 92 may be formed by a pair of cylindrical members 93—93 secured in parallel relationship to an end surface 94 of the bonding tip 90 in the manner disclosed in co-pending application Serial No. 135,051, filed in the name of A. J. Avila et al., on August 30, 1961, for A Bonding Device for Joining a Wire-like Member to a Part, now Patent No. 3,128,649, issued April 14, 1964. A groove 96 having arcuate, converging sides is formed by the pair of cylindrical members 93—93 for receiving the terminal lead 12.

The bonding tip 90 is vibrated or driven by a transducer 98 through a velocity transformer or coupler 99 provided with an output end 101 for supporting the bonding tip 90. The transducer 98 may be conditioned for "manual" or "automatic" operation by selectively positioning a multiple-contact switch 104 which completes one of a pair of first and second start circuits 106 and 108, respectively, connected in parallel between a foot switch 111 and a base 112 of a normally conductive transistor switch 114.

The first start circuit 106 includes a first contact 121 operated by the multiple-contact switch 104 and a monostable multivibrator 116 for supplying a timing signal 117 having a predetermined duration. The timing signal 117 causes the transistor switch 114 to assume a non-conductive or off condition so that a high frequency, oscillatory input signal 118 generated by an oscillator 131 is supplied to a power amplifier 133. The input signal 118 is amplified and applied to a coil 134 to energize the transducer 98. The monostable multivibrator 116 may be selectively adjusted to provide a variable duration for the timing signal 117 and permit selection of the period of time during which the transducer 98 is energized.

Electrical conductors 141 and 142 are secured by ohmic, electrical connections to the bonding tip 90, for example, and to the collector 72, respectively. When the multiple-position switch 104 is in the "manual" position, second and third contacts 122 and 123, respectively, are closed to connect the respective conductors 141 and 142 to a suitable monitoring circuit 144, such as a curve-tracing circuit which includes an indicating device 145, such as a standard oscilloscope.

With the conductors 141 and 142 secured in this manner, and with the bonding tip 90 urging the terminal lead 12 against the bonding area 14, the circuit 144 is completed from the oscilloscope 145, through the now-closed contact 122, through the conductor 141, through the bonding tip 90, through the terminal lead 12, through the base stripe 82, through the base 70, through the base-collector junction 78, through the collector 72, through the conductor 142, and through the now-closed contact 123 to the oscilloscope 145. The oscilloscope 145 is provided with a screen 148 which indicates the voltage-current characteristics of the base-collector junction 78.

With the transistor 16 and the bonding tool 10 at a normal or ambient room temperature of 72° F., for example, the multiple-position switch 104 is located in the "manual" position to condition the bonding tool for manual operation. The foot switch 111 is actuated to energize the multivibrator 116 which turns the transistor switch 114 off. With the transistor switch 114 off, the input signal is applied to the power amplifier 133 for energizing the transducer 98 which applies the high-frequency vibration to the coupler 99 and the bonding tip 90. The bonding tip 90 is pressed toward the bonding area 14 to urge the terminal lead 12 against the base stripe 82. The terminal lead 12 is vibrated by the bonding tip 90 substantially parallel to the upper surface 86 of the base stripe 82. Such vibration of the terminal lead 12 mechanically and electrically bonds the terminal lead 12 to the base stripe 82 and applies vibratory energy to the bonding area 14. The vibratory energy is dissipated in the transistor 16 in the form of heat which increases the temperature of the base-collector junction 78. Such increase in temperature changes the voltage-current characteristics of the base-collector junction 78, causing increasing conductivity in both the forward and reverse directions. Curves 149, 151, and 153, similar to the respective curves 21, 22, and 23, of the graph 20, appear in succession on the screen 148 to indicate the respective voltage-current characteristics before, during and immediately after bonding and to indicate the amount of bonding energy utilized to bond the terminal lead 12 to the base stripe 82. The peak or maximum change in the voltage drop indicated by the curve 153 is noted and reference made to the graph 30 shown in FIG. 3 illustrating the relative quality of the bond plotted as a function of the change of the relative voltage across the base-collector junction 78 during bonding. With the peak change in the voltage drop known, the curve 32 is used to determine the quality of the bond produced between the terminal lead 12 and the base stripe 82 so that the quality of the bond is determined without destroying the bond.

If the peak change in the voltage drop is 4 units, for example, the relative bond quality indicated by the curve 32 is 6, which is lower than 7, the value corresponding to the maximum point 34 on the curve 32. The monostable multivibrator 116 is adjusted to increase the duration of the timing signal 117. If the duration of the timing signal 117 has been increased sufficiently, the peak change in the voltage drop indicated on the oscilloscope screen 148 during bonding of another terminal lead 12 to a transistor 16, will equal 5 units, indicating that the maximum bond quality of 7 has been achieved.

As shown in FIG. 1, the present method also contemplates utilization of the change in the voltage drop across the base-collector junction 78, for example, for controlling the duration of the input signal 118 to the transducer 98.

To provide such control, the multiple-position switch 104 is located in the "automatic" position to connect the second start circuit 108 to the transistor switch 114. The second start circuit 108 includes a flip-flop 161 and a fourth, no-closed contact 124 of the multiple-position switch 104. Operation of the foot switch 111 causes the flip-flop 161 to supply a timing signal 162 to the transistor switch 114. The timing signal 116 turns the transistor switch 114 off to permit the input signal 118 to pass to the power amplifier 133.

In the "automatic" position of the multiple-position switch 104, a fifth contact 125 is closed to connect a constant current generator 164 to the conductor 141, and the second and third contacts 122 and 123, respectively, are opened. A sixth contact 126 is also closed in the "automatic" position to connect the conductor 142 to a trigger circuit 166 which generates a signal timing pulse 168 in response to application thereon of a predetermined voltage from the collector 72. The signal timing pulse 168 causes the flip-flop 161 to flop so that the timing signal 162 is interrupted. With the timing signal 162 interrupted, the transistor switch 114 is again rendered conductive and is effective to shunt the input signal 118 to ground.

With the transistor 16 and the bonding tool 10 at the ambient room temperature, the multiple-position switch 104 is located in the "automatic" position to condition the bonding tool 10 for automatic operation. The foot switch 111 is actuated to flop the flip-flop 161 and render the transistor switch 114 effective to permit the input signal 118 to pass to the power amplifier 133. The amplified input signal 118 energizes the transducer 98 which applies the high-frequency vibration to the bonding tip 90. The bonding tip 90 is pressed toward the bonding area 14 to urge the terminal lead 12 against the base stripe 82. With the first, second, and third contacts 121, 122, and 123, respectively, open, and the fourth, fifth, and sixth contacts 124, 125, and 126, respectively, closed, constant current is passed from the constant current generator 164 through the conductor 141, through the base-collector junction 78 and through the conductor 142 to the trigger circuit 166.

The terminal lead 12 is vibrated by the bonding tip 90 substantially parallel to the upper surface 86 of the base stripe 82. Such vibration of the terminal lead 12 mechanically and electrically bonds the terminal lead 12 to the base stripe 82 and applies vibratory bonding energy to the bonding area 14. The vibratory energy is dissipated in the transistor 16 in the form of heat which increases the temperature of the base-collector junction 78. Such increase in temperature changes the voltage-current characteristics of the base-collector junction 78 such as by changing the voltage drop across the base-collector junction 78. The trigger circuit 166 is adapted to respond to a predetermined change in the voltage drop, which change equals the change in voltage corresponding to the point 34, for example, on the graph 30, at which point the quality of the bond equals the maximum value 7. In response to the predetermined change of voltage drop, the trigger circuit 166 generates the signal timing pulse 168 for interrupting timing signal 162. With the timing signal interrupted, the transistor switch 114 shunts the input signal 118 to ground so that the transducer 98 is de-energized. It may be understood that the bond is formed between the terminal lead 12 and the base stripe 82 having maximum quality because the bonding operation is interrupted at the point of maximum strength of the bond and minimum deformation of the terminal lead 12. Such interruption prevents the application of excessive bonding energy which results in poor bond quality as indicated in reference to FIG. 5. With the application of excessive bonding energy precluded, damage to the bond is prevented and high bond quality is assured.

The curve 32 of FIG. 3 has been described with reference to the relative bond quality of the transistor 16.

It is to be understood that curves (not shown) similar to the curve 32 may be prepared in accordance with the principles of the present invention for other electrical components having rectifying junctions, for example. More particularly, by bonding a number of electrical conductors to a number of such electrical components, testing the bonds to determine the resulting bond quality, determining the relative voltage drops, and relating the relative bond quality to the relative voltage change during and immediately after bonding, a curve similar to the curve 32 may be prepared for monitoring and controlling the bonding of additional ones of such components.

It is to be understood that the above described arrangements are simply illustrative of the application of the principles of this invention. Numerous other arrangements may be readily devised by those skilled in the art which will embody the principles of the invention and fall within the spirit and scope thereof.

What is claimed is:

1. In a method of forming a bond between an electrical conductor and an electrode of an electrical component, said component having an electrical characteristic which varies from an initial value according to the amount of energy utilized to effect said bond, the steps of:
 urging the conductor and the electrode into mutual contact,
 applying ultrasonic bonding energy to the contacting conductor and electrode to effect the bond and vary the electrical characteristic of the component, and
 measuring the variation of the electrical characteristic from said initial value to obtain an indication of the mechanical characteristics of the bond.

2. The method of forming a bond between an electrical conductor and an electrode of an electrical component, said component having an electrical characteristic which varies from an initial value according to the amount of energy utilized to effect said bond, which comprises:
 urging the conductor and the electrode into mutual contact,
 applying ultrasonic bonding energy to the contacting conductor and electrode to effect the bond and vary the electrical characteristic of the component,
 measuring the variation of the electrical characteristic from said initial value to obtain an indication of the mechanical characteristics of the bond, and
 interrupting the application of the bonding energy upon measurement of a selected variation of the electrical characteristic so that the bond is formed with predetermined mechanical characteristics.

3. The method of making a bond having given mechanical characteristics wherein the bond is formed between a terminal lead and an electrode of an electrical component, the component having an electrical characteristic which varies from an initial value according to the temperature of the component, which comprises:
 urging the terminal lead and the electrode into mutual engagement,
 applying ultrasonic bonding energy to the engaged terminal lead and electrode to form the bond, the bonding energy causing the temperature of the component to vary from the given value;
 measuring the variation of said electrical characteristic from the initial value to obtain an indication of the mechanical characteristics of the bond, and
 interrupting the bonding energy upon measurement of a given variation of said electrical characteristic so that the bond is formed with the given mechanical characteristics.

4. In a method of forming a bond between a terminal lead and an electrode of an electrical component, said component having an electrical characteristic which varies from a given value according to the temperature of the component, the steps of:
 urging the terminal lead and the electrode into mutual engagement, vibrating the terminal lead and the electrode relative to each other to form the bond, the vibration causing the temperature of the component to vary according to the mechanical characteristics of the bond so that the electrical characteristic varies from the given value, and
 measuring the variation of said electrical characteristic from said initial value to obtain an indication of the mechanical characteristics of the bond.

5. In a method of forming a bond between an electrical conductor and a semiconductor component, said component having a junction which develops a voltage drop thereacross when current is passed therethrough, said voltage drop being variable according to the temperature of said junction, the steps of:
 urging the conductor into engagement with the component,
 passing current through the junction to develop an initial voltage drop thereacross,
 applying high frequency vibration to said conductor to bond the conductor to the component, said high frequency vibration causing a change in the temperature of the junction, and
 monitoring the voltage drop developed across the junction during the application of the high frequency vibration to determine the variation of said voltage drop from said initial value to obtain an indication of the mechanical charactertistics of the bond.

6. The method of forming an optimum strength bond between a terminal lead and an electrode secured to a semiconductor device having a junction which develops a temperature dependent voltage thereacross upon passage therethrough of a current, which comprises:
 pressing a vibratory bonding tool toward the device to urge the terminal lead into contact with the electrode,
 passing a current through the junction to develop an initial voltage thereacross,
 vibrating the vibratory bonding tool to effect the bond between the terminal lead and the electrode and to cause the junction temperature to change, thereby causing the voltage developed across the junction to change from said initial value,
 monitoring the change of the voltage from said initial value to obtain an indication of the quality of the bond, and
 interrupting the vibration of the vibratory bonding tool upon indication of a predetermined change in said voltage so that the bond is formed having optimum strength.

7. The method of ultrasonically forming desired quality bonds between conductive elements and electrical components of a type having an electrical characteristic which varies from an initial value according to the amount of energy utilized to effect the bond, which comprises:
 (a) placing a conductive element in contact with one of the components;
 (b) ultrasonically bonding the element to the component by applying a pulse of ultrasonic energy thereto with adjustable pulse duration ultrasonic apparatus;
 (c) measuring the change in the characteristic of the component from the initial value thereof;
 (d) determining from a predetermined bond quality versus change in the characteristic relationship for the component, the quality of the bond;
 (e) adjusting the pulse duration of the bonding pulse if the quality of the bond determined in Step (d) is less than that desired;
 (f) repeating Steps (b) to (e), inclusive, until a bond is achieved of the desired quality; and
 (g) successively bonding ultrasonically with the pulse duration ultimately achieved in Step (f) respective conductive elements to a plurality of the components.

8. The method of claim 7 wherein:

the components are semiconductor devices of the type having a rectifying junction, the electrical characteristic is the junction forward resistance which changes according to the amount of bonding energy utilized, and Step (c) is performed by passing a constant current through the junction and measuring the change in the voltage developed thereacross.

References Cited by the Examiner

UNITED STATES PATENTS

| | | | |
|---|---|---|---|
| 1,975,753 | 10/1934 | Delano et al. | 219—4 |
| 2,696,739 | 12/1954 | Endres | 73—362 |
| 2,942,097 | 6/1960 | Baas | 219—110 |
| 3,149,221 | 9/1964 | Watter et al. | 219—110 |
| 3,212,695 | 10/1965 | MacGregor | 228—1 |

JOHN F. CAMPBELL, *Primary Examiner.*

M. L. FAIGUS, *Assistant Examiner.*